(12) United States Patent
Do et al.

(10) Patent No.: US 8,378,477 B2
(45) Date of Patent: Feb. 19, 2013

(54) INTEGRATED CIRCUIT PACKAGING SYSTEM WITH FILM ENCAPSULATION AND METHOD OF MANUFACTURE THEREOF

(75) Inventors: Byung Tai Do, Singapore (SG); Linda Pei Ee Chua, Singapore (SG); Reza Argenty Pagaila, Singapore (SG)

(73) Assignee: Stats Chippac Ltd., Singapore (SG)

( * ) Notice: Subject to any disclaimer, the term of this patent is extended or adjusted under 35 U.S.C. 154(b) by 51 days.

(21) Appl. No.: 12/882,067

(22) Filed: Sep. 14, 2010

(65) Prior Publication Data

US 2012/0061855 A1 Mar. 15, 2012

(51) Int. Cl.
*H01L 23/02* (2006.01)

(52) U.S. Cl. ............ 257/686; 257/E21.502; 257/685; 257/777; 438/109; 438/127

(58) Field of Classification Search ........... 257/E21.499, 257/E21.502, E21.503, 685, 686, 777, 778; 438/127, 107–109, 112, 124
See application file for complete search history.

(56) References Cited

U.S. PATENT DOCUMENTS

| | | | |
|---|---|---|---|
| 5,222,014 A * | 6/1993 | Lin | 361/792 |
| 5,594,275 A * | 1/1997 | Kwon et al. | 257/686 |
| 5,883,426 A * | 3/1999 | Tokuno et al. | 257/686 |
| 6,025,648 A * | 2/2000 | Takahashi et al. | 257/778 |
| 6,194,250 B1 * | 2/2001 | Melton et al. | 438/126 |
| 6,388,333 B1 * | 5/2002 | Taniguchi et al. | 257/777 |
| 6,770,980 B2 * | 8/2004 | Shibata | 257/777 |
| 6,815,254 B2 * | 11/2004 | Mistry et al. | 438/108 |
| 6,960,827 B2 * | 11/2005 | Nishimura et al. | 257/723 |
| 7,018,866 B2 | 3/2006 | Sugaya et al. | |
| 7,129,113 B1 | 10/2006 | Lin et al. | |
| 7,173,325 B2 * | 2/2007 | Vasoya et al. | 257/686 |
| 7,180,165 B2 * | 2/2007 | Ellsberry et al. | 257/686 |
| 7,187,068 B2 * | 3/2007 | Suh et al. | 257/685 |
| 7,208,824 B2 * | 4/2007 | Lee et al. | 257/686 |
| 7,294,928 B2 * | 11/2007 | Bang et al. | 257/737 |
| 7,391,118 B2 * | 6/2008 | Tsai | 257/778 |
| 7,498,666 B2 * | 3/2009 | Hussa | 257/686 |
| 7,851,259 B2 * | 12/2010 | Kim | 438/108 |
| 7,855,443 B2 * | 12/2010 | Tsai et al. | 257/686 |
| 8,008,121 B2 * | 8/2011 | Choi et al. | 438/107 |
| 8,106,495 B2 * | 1/2012 | Kajiki | 257/678 |
| 2001/0028114 A1 * | 10/2001 | Hosomi | 257/778 |
| 2003/0006494 A1 * | 1/2003 | Lee et al. | 257/686 |
| 2004/0262728 A1 * | 12/2004 | Sterrett et al. | 257/678 |
| 2005/0121764 A1 * | 6/2005 | Mallik et al. | 257/686 |
| 2006/0275952 A1 | 12/2006 | Gowda et al. | |
| 2008/0157329 A1 * | 7/2008 | Inoue | 257/686 |
| 2009/0206461 A1 | 8/2009 | Yoon | |

\* cited by examiner

*Primary Examiner* — Chris Chu
(74) *Attorney, Agent, or Firm* — Ishimaru & Associates; Mikio Ishimaru

(57) ABSTRACT

A method of manufacture of an integrated circuit packaging system includes: providing a package substrate having a substrate bottom side and a substrate top side opposite the substrate bottom side; mounting an integrated circuit over the package substrate, the integrated circuit having an inactive side and an active side opposite the inactive side; connecting stack connectors to the substrate top side; applying a multi-layer film over the substrate top side, the integrated circuit, and the stack connectors, the multi-layer film having a base film layer, a penetrable film layer, and a penetrable adhesive; removing the base film layer and the penetrable film layer to expose the penetrable adhesive and exposed portions of the stack connectors; and forming an adhesive film layer by hardening the penetrable adhesive.

20 Claims, 6 Drawing Sheets

INTEGRATED CIRCUIT PACKAGING SYSTEM WITH FILM ENCAPSULATION AND METHOD OF MANUFACTURE THEREOF

TECHNICAL FIELD

The present invention relates generally to an integrated circuit packaging system, and more particularly to a system for encapsulation.

BACKGROUND ART

Ongoing goals of the computer industry include higher performance, lower cost, increased miniaturization of components, and greater packaging density of integrated circuits ("IC's"). As new generations of IC products are released, their functionality increases while the number of components needed to fabricate them decreases.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual die on a substrate.

Modem electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

One proven way to reduce cost is to use mature package technologies with existing manufacturing methods and equipments. Paradoxically, the reuse of existing manufacturing processes does not typically result in the reduction of package dimensions.

Thus, a need still remains for an integrated circuit packaging system including smaller size, lower cost, more functionality, and performance. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package substrate having a substrate bottom side and a substrate top side opposite the substrate bottom side; mounting an integrated circuit over the package substrate, the integrated circuit having an inactive side and an active side opposite the inactive side; connecting stack connectors to the substrate top side; applying a multi-layer film over the substrate top side, the integrated circuit, and the stack connectors, the multi-layer film having a base film layer, a penetrable film layer, and a penetrable adhesive; removing the base film layer and the penetrable film layer to expose the penetrable adhesive and exposed portions of the stack connectors; and forming an adhesive film layer by hardening the penetrable adhesive.

The present invention provides an integrated circuit packaging system, including: a package substrate having a substrate bottom side and a substrate top side opposite the substrate bottom side; an integrated circuit over the package substrate, the integrated circuit having an inactive side and an active side opposite the inactive side; stack connectors connected to the substrate top side; an adhesive film layer over the substrate top side covering the integrated circuit and portions of the stack connectors; and exposed portions of the stack connectors with a portion of the adhesive film layer adhered to the stack connectors above a film top surface of the adhesive film layer characteristic of a penetrable adhesive penetrated by the stack connectors.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
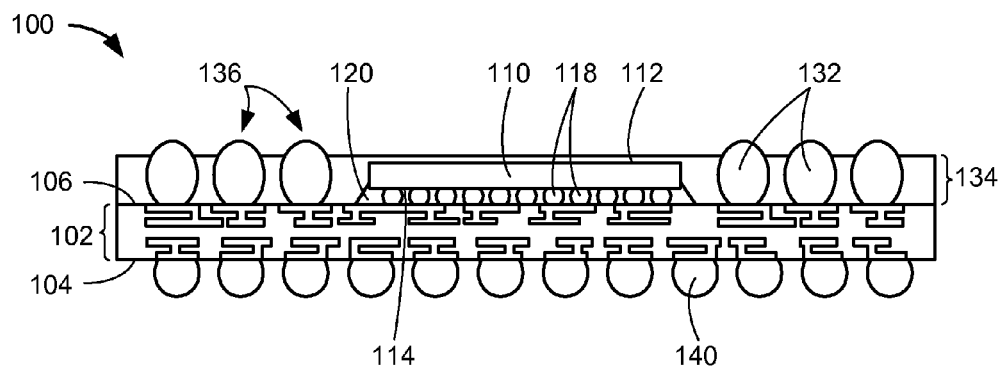
FIG. 1 is a cross-sectional view of an integrated circuit packaging system along a section line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Conventional package-on-package (PoP) presents a technical challenge due to a problem of poor solder joint-ability. Solder joint-ability between a top solder ball (of a top package) and an embedded solder ball (of a bottom package) is poor due to a small contact area exposed from the embedded solder ball. If small solder balls are to be used on flat under bump metallization (UBM), solder joints can be relatively weak. Such weakness will be aggravated on occasions when a substrate warpage occurs.

A package-on-package bottom (PoPb) molded laser package-on-package (MLP) package, such as a flip chip very thin profile fine pitch ball grid array (fcWFBGA) package-on-package bottom (PoPb) molded laser package-on-package (MLP) package (fcWFBGA-PoPb MLP), offers better solder joint-ability. However, it requires a laser drilling process to create individual holes to expose solder balls. In this case, a precise laser hole size and a position tolerance are required. In addition, it requires a cleaning process to remove epoxy molding compound (EMC) residue on the solder balls after laser drilling, hence incurring a problem of more cost and time.

A step-molded package-on-package (PoP), such as a very thin profile fine pitch ball grid array (VFBGA) package-on-package bottom (PoPb) exposed solder-on-pad (eSOP) package (VFBGA-PoPb-eSOP), offers a lower height package-on-package (PoP). However, it needs partial sawing processes, which commonly needs a 4-pass sawing, to create such a step having a depth of approximately 0.17 millimeters (mm), hence incurring a problem of more cost and time. In addition, it has a potential problem of having mold compound particles embedded in the solder-on-pad (SOP) surface during a half-cut process. Embodiments of the present invention provide answers or solutions to these problems.

Figure 2:
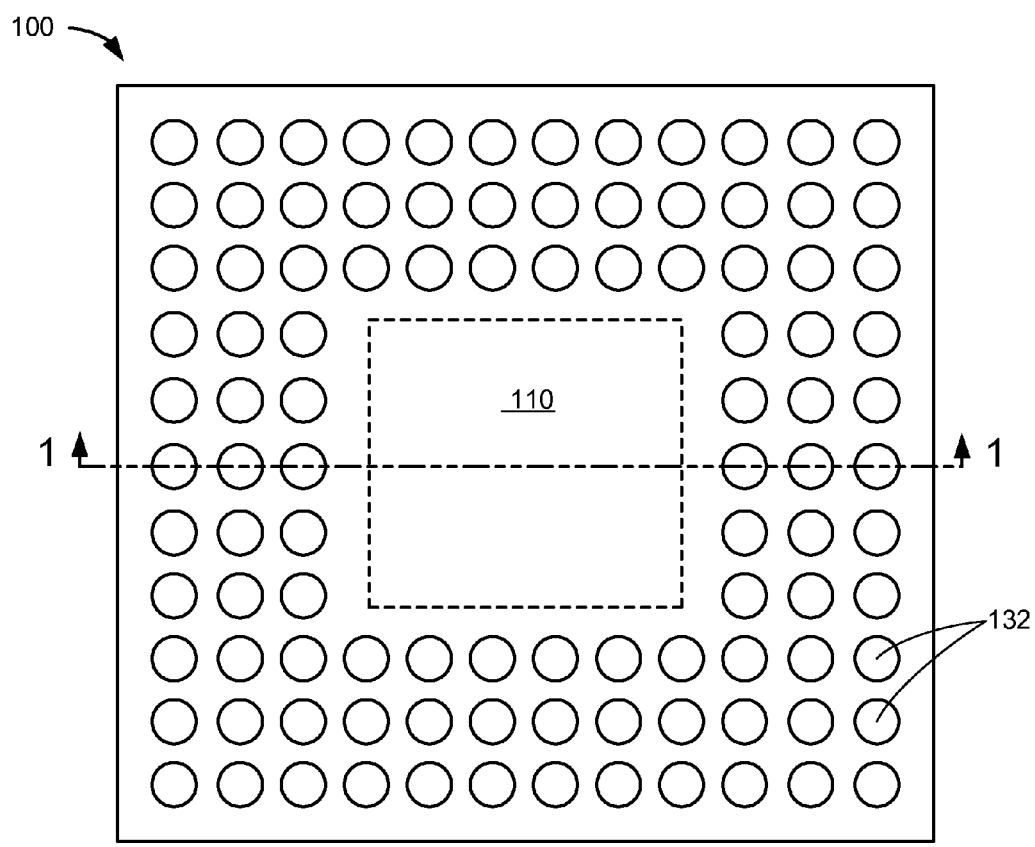
FIG. 2 is a top view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can include a package with a film encapsulation material to form protruding interconnects.

The integrated circuit packaging system 100 can include a package substrate 102, which is a support structure for mounting and electrically connecting a semiconductor device thereto. For example, the package substrate 102 can include a base substrate.

The package substrate 102 can include a substrate bottom side 104 and a substrate top side 106 opposite the substrate bottom side 104. The package substrate 102 can be electrically connected between the substrate bottom side 104 and the substrate top side 106.

An integrated circuit 110 can be mounted over a central portion of the substrate top side 106. The integrated circuit 110 is a semiconductor device including a flip chip, a flip chip die, or an integrated circuit die. The integrated circuit 110 can include an inactive side 112 and an active side 114 opposite the inactive side 112.

Device connectors 118 electrically connect the substrate top side 106 and the integrated circuit 110. The device connectors 118 can be attached to the substrate top side 106 and the active side 114.

An underfill layer 120 can be formed between the substrate top side 106 and the active side 114 to protect the device connectors 118. The underfill layer 120 can be formed surrounding the device connectors 118.

Stack connectors 132, which are electrically conductive connectors, can be attached to the substrate top side 106. The stack connectors 132 provide electrical connectivity to a semiconductor component (not shown) that is mounted over the substrate top side 106. The stack connectors 132 can be electrically connected to the substrate top side 106.

The stack connectors 132 can be adjacent non-horizontal sides of the integrated circuit 110. The stack connectors 132 can be between the integrated circuit 110 and a periphery of a top surface of the package substrate 102. The top surface of the package substrate 102 is at the substrate top side 106.

An adhesive film layer 134 can be formed over the substrate top side 106 and the integrated circuit 110. The adhesive film layer 134 formed with an insulating material including a film encapsulation material provides mechanical and environmental protection. The adhesive film layer 134 covers the integrated circuit 110, the underfill layer 120, and portions of the stack connectors 132. The adhesive film layer 134 can include a penetrable material including B-Stage material. The penetrable material is further described in subsequent FIG. descriptions.

The stack connectors 132 can include exposed portions 136, which are ends of the stack connectors 132 that face away from the substrate top side 106. The exposed portions 136 can be exposed and protruding from the adhesive film layer 134.

External interconnects 140 can be attached to the substrate bottom side 104. The external interconnects 140 are electrical connectors that provide electrical connectivity between the package substrate 102 and external systems (not shown).

It has been discovered that the adhesive film layer 134 partially encapsulating the stack connectors 132 and the exposed portions 136 of the stack connectors 132 protruding from the adhesive film layer 134 significantly improve solder joint reliability.

Referring now to FIG. 2, therein is shown a top view of the integrated circuit packaging system 100. The stack connectors 132 can be surrounding the integrated circuit 110, shown as a dash square. The stack connectors 132 can be formed in multiple rows. The stack connectors 132 can be formed in a peripheral array, which includes a number of rows of the stack connectors 132 adjacent and within a periphery of a top surface of the substrate top side 106 of FIG. 1.

For illustrative purposes, the stack connectors 132 are shown in three rows, although it is understood that the stack connectors 132 can be formed in any number of rows. Also for illustrative purposes, the stack connectors 132 are shown in a circular shape, although it is understood that the stack connectors 132 can have any other shape.

Figure 3:
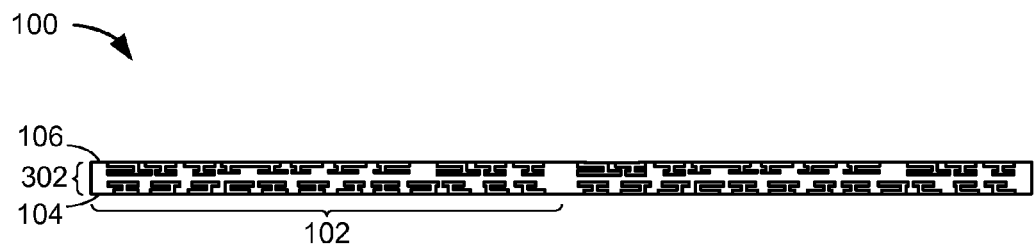
FIG. 3 is a cross-sectional view of the integrated circuit packaging system taken along line 1-1 of FIG. 2 in a substrate providing phase of manufacture.

Referring now to FIG. 3, therein is shown a cross-sectional view of the integrated circuit packaging system 100 taken along line 1-1 of FIG. 2 in a substrate providing phase of manufacture. The integrated circuit packaging system 100 can include a substrate strip 302, which includes a number of the package substrate 102.

The package substrate 102 can include vias, traces, contacts, or a combination thereof that is electrically connected. The package substrate 102 can include the substrate bottom side 104 and the substrate top side 106. For illustrative purposes, the substrate providing phase includes the substrate strip 302 having the package substrate 102, although it is understood that the substrate providing phase can include a strip of a number of support structures including a leadframe, a cavity substrate, a substrate with a recess, a silicon substrate, or a temporary carrier.

Figure 4:
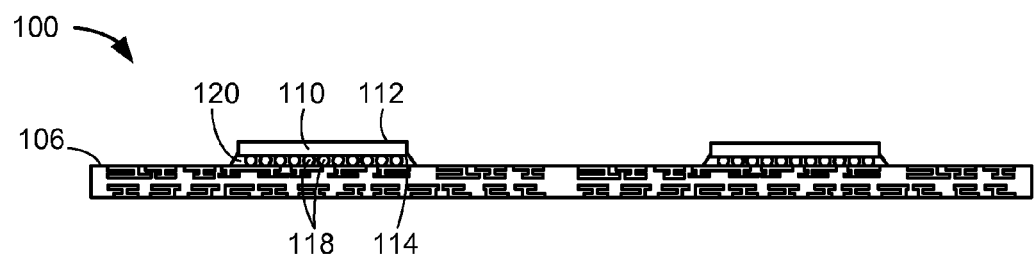
FIG. 4 is the structure of FIG. 3 in a device attaching phase.

Referring now to FIG. 4, therein is shown the structure of FIG. 3 in a device attaching phase. The integrated circuit packaging system 100 can include the integrated circuit 110 having the inactive side 112 and the active side 114. The integrated circuit 110 can be mounted over the substrate top side 106. The integrated circuit 110 can be attached to the substrate top side 106 with the device connectors 118.

The device connectors 118 can be formed with a conductive material including solder, a metal, or a metallic alloy. For illustrative purposes, the device connectors 118 are shown as conductive bumps, although it is understood that the device connectors 118 can be any electrically conductive connectors.

The underfill layer 120 can be dispensed in a space between the substrate top side 106 and the active side 114. The underfill layer 120 can be formed surrounding the device connectors 118. The underfill layer 120 can be formed with an underfill material including a resin underfill or an epoxy resin.

Figure 5:
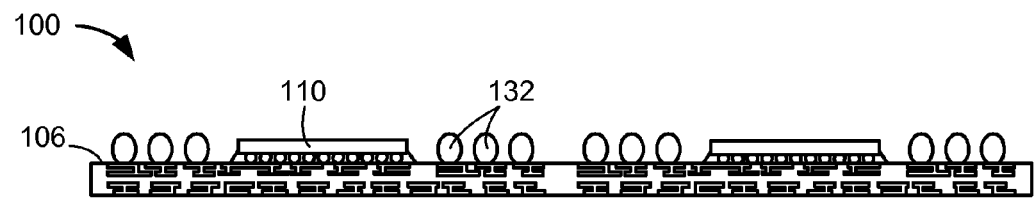
FIG. 5 is the structure of FIG. 4 in a connector attaching phase.

Referring now to FIG. 5, therein is shown the structure of FIG. 4 in a connector attaching phase. The stack connectors 132 can be deposited directly on the substrate top side 106. The stack connectors 132 can be adjacent the integrated circuit 110.

The stack connectors 132 can be formed with a conductive material including solder, copper (Cu), a metal, a metallic alloy, or any combination thereof. For example, the stack connectors 132 can be solder balls or stacked interconnects.

For illustrative purposes, the stack connectors 132 are shown as conductive balls, although it is understood that the stack connectors 132 can be any electrically conductive connectors including conductive pillars. Also for illustrative purposes, the stack connectors 132 are shown having an oval shape, although it is understood that the stack connectors 132 can have any other shapes.

Figure 6:
FIG. 6 is a cross-sectional view of the integrated circuit packaging system in a film providing phase.

Referring now to FIG. 6, therein is shown a cross-sectional view of the integrated circuit packaging system 100 in a film providing phase. The integrated circuit packaging system 100 can include a multi-layer film 602.

The multi-layer film 602 can be preformed with three layers including a base film layer 604, a penetrable film layer 606, and a penetrable adhesive 608. The term preformed means that the multi-layer film 602 is formed before the multi-layer film 602 is applied in a subsequent phase of manufacture.

The multi-layer film 602 can include an insulating material or a film encapsulation material including an ultraviolet (UV) B-Stage penetrable film adhesive material. For illustrative purposes, the multi-layer film 602 is shown with three layers, although it is understood that the multi-layer film 602 can be formed with any number of layers.

The base film layer 604 provides a rigid structure that prevents the multi-layer film 602 from being bent for lamination purposes in a subsequent phase of manufacture. The base film layer 604 can protect and cover the penetrable film layer 606 and the penetrable adhesive 608.

The penetrable film layer 606 is an adhesive layer that attaches the penetrable adhesive 608 to the base film layer 604. The penetrable film layer 606 can be formed with an insulating material including an ultraviolet (UV) B-Stage film adhesive material. The penetrable film layer 606 can be between the base film layer 604 and the penetrable adhesive 608. The penetrable film layer 606 can be attached to the base film layer 604 and the penetrable adhesive 608.

The penetrable adhesive 608 is an adhesive that is to be attached to the substrate top side 106 of FIG. 1 to encapsulate portions of the stack connectors 132 of FIG. 1 in a subsequent phase of manufacture. The penetrable adhesive 608 can be attached to the penetrable film layer 606. The penetrable adhesive 608 can preferably be formed of a penetrable material including B-Stage material. For example, the penetrable adhesive 608 can be formed with an encapsulation material including a film encapsulation material.

The multi-layer film 602 can be heated to an elevated temperature to make the penetrable film layer 606, the penetrable adhesive 608, or a combination thereof flowable. The multi-layer film 602 can be provided as a sheet or a pre-cut form.

Figure 7:
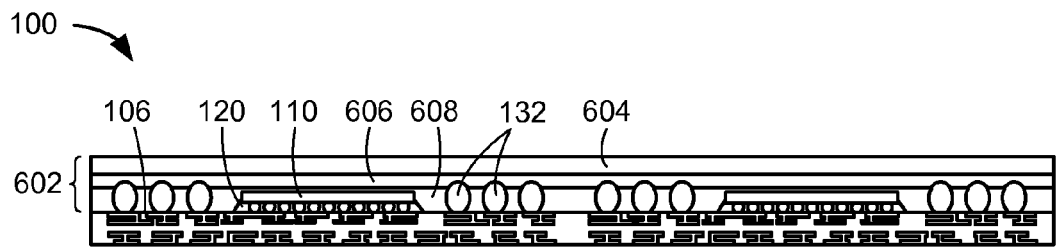
FIG. 7 is the structure of FIG. 5 in a lamination phase.

Referring now to FIG. 7, therein is shown the structure of FIG. 5 in a lamination phase. Encapsulation can include a lamination process with the multi-layer film 602. Encapsulation of the integrated circuit 110 and portions of the stack connectors 132 can be performed with the lamination process.

The substrate top side 106 can be laminated with the multi-layer film 602 applied over the substrate top side 106, the integrated circuit 110, and the stack connectors 132. The substrate top side 106 can be laminated by applying a force on the base film layer 604 to press the multi-layer film 602 on the substrate top side 106.

The penetrable adhesive 608 can be applied on the substrate top side 106. The penetrable adhesive 608 can be attached to the substrate top side 106. The penetrable adhesive 608 can cover the integrated circuit 110, the underfill layer 120, and at least half of the stack connectors 132. The penetrable adhesive 608 can be in a penetrable or flowable state.

Portions of the stack connectors 132 can penetrate the penetrable film layer 606. Further, the integrated circuit 110, the underfill layer 120, and remaining portions of the stack connectors 132 can penetrate the penetrable adhesive 608. The remaining portions of the stack connectors 132 that penetrate the penetrable adhesive 608 can be at least half of the stack connectors 132.

Figure 8:
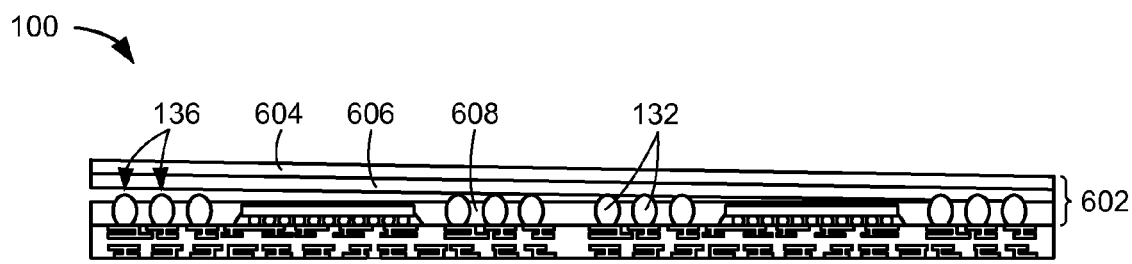
FIG. 8 is the structure of FIG. 7 in a removal phase.

Referring now to FIG. 8, therein is shown the structure of FIG. 7 in a removal phase. The removal phase is shown with the base film layer 604 and the penetrable film layer 606 in a process of being removed.

The removal phase can include an ultraviolet (UV) irradiation process to harden or cure the penetrable film layer 606. The removal phase can undergo a removal process to remove including strip out the base film layer 604 together with the penetrable film layer 606. With the base film layer 604 and the penetrable film layer 606 removed, the exposed portions 136 can be exposed and protruding from the penetrable adhesive 608.

The stack connectors 132 can include characteristics of the penetrable film layer 606 and the penetrable adhesive 608 applied directly on the stack connectors 132 in the lamination phase. The characteristics of the penetrable film layer 606 and the penetrable adhesive 608 applied directly on the stack connectors 132 can include residue of the penetrable film layer 606 directly on the exposed portions 136 when the removal phase is completed.

It has been discovered that encapsulating the stack connectors 132 with the multi-layer film 602 having the base film layer 604, the penetrable film layer 606, and the penetrable adhesive 608 improves removal of the base film layer 604 and the penetrable film layer 606 to expose a portion of the stack connectors 132 significantly improving solder joint reliability.

It has been unexpectedly found that the residue of the penetrable film layer 606 directly on the stack connectors 132 does not affect joint reliability between the stack connectors 132 and a top semiconductor component mounted thereon.

Figure 9:
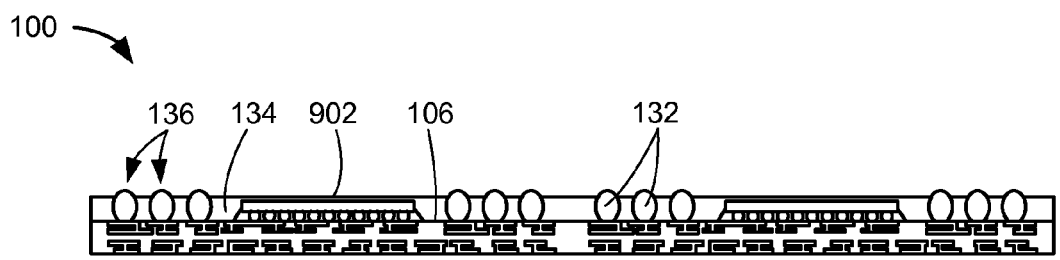
FIG. 9 is the structure of FIG. 8 in a curing phase.

Referring now to FIG. 9, therein is shown the structure of FIG. 8 in a curing phase. The curing phase can include a cure process including an oven cure process. The curing phase can be performed to harden the penetrable adhesive 608 of FIG. 8 to form the adhesive film layer 134.

The adhesive film layer 134 can include characteristics of being formed with the base film layer 604 of FIG. 8 and the penetrable film layer 606 of FIG. 8 removed. The characteristics of being formed with the base film layer 604 and the penetrable film layer 606 removed can include the adhesive film layer 134 having a rough top surface that is irregularly shaped, irregularly patterned, irregularly contoured, or a combination thereof.

The rough top surface of the adhesive film layer 134 can include a portion of the adhesive film layer 134, which adheres to a bottom surface of the penetrable film layer 606, stretches and rises as the penetrable film layer 606 is removed. The portion can be separated from the penetrable film layer 606 due to a cohesive property of the penetrable adhesive 608 of FIG. 8. The portion can remain raised before the cure process completes.

The characteristics of being formed with the base film layer 604 and the penetrable film layer 606 removed are different from characteristics of a mold cap (not shown) formed with a mold chase (not shown) and a mold material (not shown) including an encapsulant or an epoxy mold compound (EMC). The characteristics of being formed with the base film layer 604 and the penetrable film layer 606 removed can lack mold chase marks including an impression, a dent, a seam, a vent hole, or a removal tool mark including a planarized mark, a grinding mark, or a sanding mark.

The adhesive film layer 134 can include characteristics of being formed with the base film layer 604. The characteristics of being formed with the base film layer 604 can include the adhesive film layer 134 having a substantially uniform thickness. In other words, with the base film layer 604 having a rigid structure, the penetrable film layer 606 of FIG. 7 and the penetrable adhesive 608 of FIG. 7 can be substantially uniformly pressed on the substrate top side 106, resulting in the adhesive film layer 134 having the substantially uniform thickness.

The characteristics of the penetrable film layer 606 of FIG. 7 and the penetrable adhesive 608 of FIG. 7 applied directly on the stack connectors 132 can include the adhesive film layer 134 having a film protrusion (not shown) extending from a film top surface 902 of the adhesive film layer 134. The film protrusion can conform to a surface of the stack connectors 132 and can be partially formed on the exposed portions 136. The film protrusion can be formed due to a cohesive property of the penetrable adhesive 608 that holds the penetrable adhesive 608 together as the penetrable film layer 606 and the penetrable adhesive 608 are applied on the stack connectors 132.

The adhesive film layer 134 can include characteristics of being formed with the penetrable adhesive 608 in a penetrable state and penetrated by the stack connectors 132. The characteristics of being formed with the penetrable adhesive 608 in a penetrable state and penetrated by the stack connectors 132 can include a portion of the adhesive film layer 134 adhered to the stack connectors 132 and above the film top surface 902 of the adhesive film layer 134.

Figure 10:
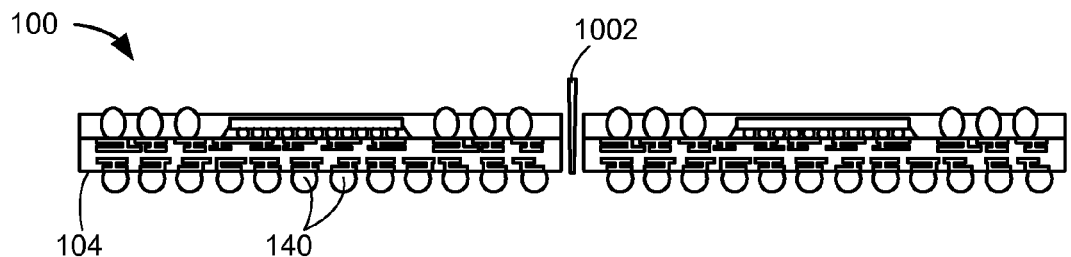
FIG. 10 is the structure of FIG. 9 in an interconnect attaching phase.

Referring now to FIG. 10, therein is shown the structure of FIG. 9 in an interconnect attaching phase. The external interconnects 140 can be attached to the substrate bottom side 104. The external interconnects 140 can be formed with a conductive material including solder, a metal, or a metallic alloy. For example, the external interconnects 140 can be solder balls. For illustrative purposes, the external interconnects 140 are shown as conductive balls, although it is understood that the external interconnects 140 can be any electrically conductive connectors.

The attaching phase can include a package singulation process. The package singulation process can include a mechanical or optical process that can be used to produce individual package units of the integrated circuit packaging system 100. The package singulation process can include a package singulation device 1002, which is a device that produces the individual package units. For example, the package singulation device 1002 can include a dicer.

Figure 11:
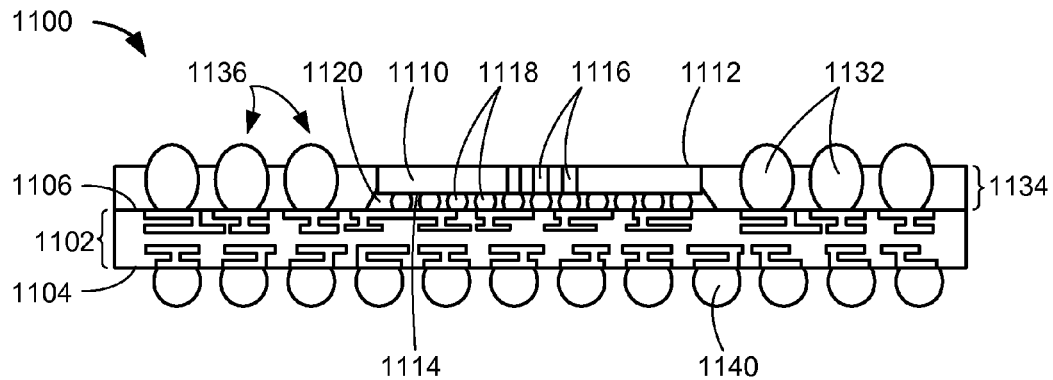
FIG. 11 is a cross-sectional view of an integrated circuit packaging system in a second embodiment of the present invention.

Referring now to FIG. 11, therein is shown a cross-sectional view of an integrated circuit packaging system 1100 in a second embodiment of the present invention. The integrated circuit packaging system 1100 can include a package with an exposed die. The integrated circuit packaging system 1100 can be formed in a manner similar to the integrated circuit packaging system 100 of FIG. 1, except for the formation of the integrated circuit 110 of FIG. 1 and the adhesive film layer 134 of FIG. 1.

The integrated circuit packaging system 1100 can include a package substrate 1102 having a substrate bottom side 1104 and a substrate top side 1106. The package substrate 1102 can be formed in a manner similar to the package substrate 102 of FIG. 1.

An integrated circuit 1110 can be mounted over a central portion of the substrate top side 1106. The integrated circuit 1110 is a semiconductor device including a flip chip, a flip chip die, or an integrated circuit die. The integrated circuit 1110 can include an inactive side 1112 and an active side 1114 opposite the inactive side 1112.

The integrated circuit 1110 can optionally include vertical insertion areas 1116 (through vias). For example, the vertical insertion areas 1116 can include a through silicon vertical insertion area (TSV). For illustrative purposes, the integrated circuit 1110 is shown with three of the vertical insertion areas 1116, although it is understood that the integrated circuit 1110 can include any number of the vertical insertion areas 1116.

The vertical insertion areas 1116 can be formed through and between a plane of the inactive side 1112 and a plane of the active side 1114. The vertical insertion areas 1116 can be formed with a conductive material including a metal or a metallic alloy. The vertical insertion areas 1116 can electrically connect the inactive side 1112 and the active side 1114.

The integrated circuit packaging system 1100 can include device connectors 1118, an underfill layer 1120, and stack connectors 1132. The device connectors 1118, the underfill layer 1120, and the stack connectors 1132 can be formed in a manner similar to the device connectors 118 of FIG. 1, the underfill layer 120 of FIG. 1, and the stack connectors 132 of FIG. 1, respectively.

The vertical insertion areas 1116 can be electrically connected to the device connectors 1118. The vertical insertion areas 1116 can electrically connect the device connectors 1118 and a semiconductor component (not shown) that is mounted over the integrated circuit 1110.

An adhesive film layer 1134 can be formed over the substrate top side 1106. The adhesive film layer 1134 is formed with an insulating material to provide mechanical and environmental protection. The adhesive film layer 1134 covers a portion of the integrated circuit 1110, the underfill layer 1120, and portions of the stack connectors 1132.

The adhesive film layer 1134 can expose the inactive side 1112 of the integrated circuit 1110. The adhesive film layer 1134 can expose top ends of the vertical insertion areas 1116. The top ends are portions of the vertical insertion areas 1116 at the inactive side 1112.

The stack connectors 1132 can include exposed portions 1136, which are ends of the stack connectors 1132 that face away from the substrate top side 1106. The exposed portions 1136 can be exposed and protruding from the adhesive film layer 1134.

The integrated circuit packaging system 1100 can include external interconnects 1140. The external interconnects 1140 can be formed in a manner similar to the external interconnects 140 of FIG. 1.

It has been discovered that the adhesive film layer 1134 partially encapsulating the stack connectors 1132 and the exposed portions 1136 of the stack connectors 1132 protruding from the adhesive film layer 1134 significantly improve solder joint reliability for a packaging system having a structure with the integrated circuit 1110 having the vertical insertion areas 1116.

It has been unexpectedly observed that the vertical insertion areas 1116 provide a significant increase of input/output density.

Figure 12:
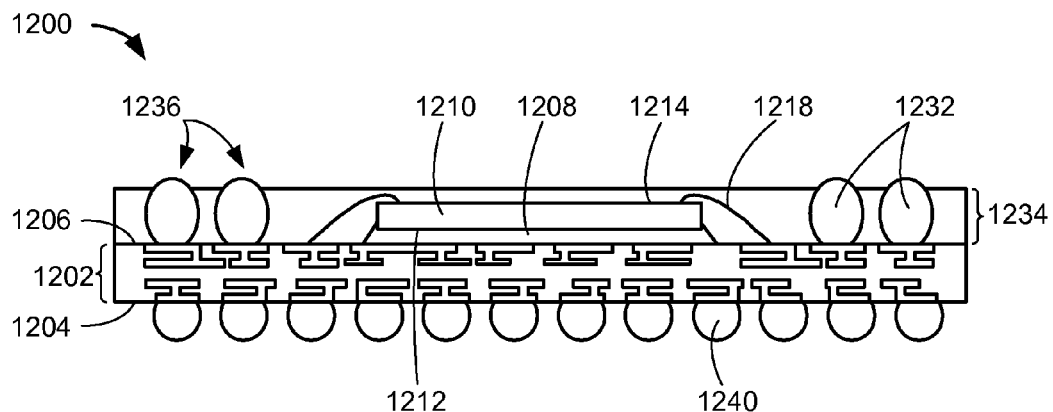
FIG. 12 is a cross-sectional view of an integrated circuit packaging system in a third embodiment of the present invention.

Referring now to FIG. 12, therein is shown a cross-sectional view of an integrated circuit packaging system 1200 in a third embodiment of the present invention. The integrated circuit packaging system 1200 can include a package with a wirebond die.

The integrated circuit packaging system 1200 can be formed in a manner similar to the integrated circuit packaging system 100 of FIG. 1, except for the formation of the integrated circuit 110 of FIG. 1, the device connectors 118 of FIG. 1, and the adhesive film layer 134 of FIG. 1. Further, the integrated circuit packaging system 1200 can be formed in a manner similar to the integrated circuit packaging system 100, except for an addition of an adhesive and without the underfill layer 120 of FIG. 1.

The integrated circuit packaging system 1200 can include a package substrate 1202 having a substrate bottom side 1204 and a substrate top side 1206. The package substrate 1202 can be formed in a manner similar to the package substrate 102 of FIG. 1.

A device attach layer 1208 attaches an integrated circuit 1210 to the substrate top side 1206. The device attach layer 1208 can include an attach material including a die attach material, an adhesive, or an epoxy. The integrated circuit 1210 is a semiconductor device including a wirebond die, a wirebond integrated circuit, or an integrated circuit die.

The integrated circuit 1210 can be mounted over a central portion of the substrate top side 1206. The integrated circuit 1210 can include an inactive side 1212 and an active side 1214 opposite the inactive side 1212. The inactive side 1212 can be attached to the substrate top side 1206 with the device attach layer 1208.

Device connectors 1218 electrically connect the substrate top side 1206 and the active side 1214. The device connectors 1218 can be adjacent a periphery of a top surface of the integrated circuit 1210. The top surface of the integrated circuit 1210 is at the active side 1214. For illustrative purposes, the device connectors 1218 are shown as bond wires, although it is understood that the device connectors 1218 can be any other electrical connectors.

The integrated circuit packaging system 1200 can include stack connectors 1232. The stack connectors 1232 can be formed in a manner similar to the stack connectors 132 of FIG. 1.

An adhesive film layer 1234 can be formed over the substrate top side 1206. The adhesive film layer 1234 is formed with an insulating material to provide mechanical and environmental protection. The adhesive film layer 1234 can cover the device attach layer 1208, the integrated circuit 1210, the device connectors 1218, and portions of the stack connectors 1232.

The stack connectors 1232 can include exposed portions 1236, which are ends of the stack connectors 1232 that face away from the substrate top side 1206. The exposed portions 1236 can be exposed and protruding from the adhesive film layer 1234.

The integrated circuit packaging system 1200 can include external interconnects 1240. The external interconnects 1240 can be formed in a manner similar to the external interconnects 140 of FIG. 1.

It has been discovered that the adhesive film layer 1234 partially encapsulating the stack connectors 1232 and the exposed portions 1236 of the stack connectors 1232 protruding from the adhesive film layer 1234 significantly improve solder joint reliability for a packaging system having a structure with the integrated circuit 1210 including a wirebond die.

Figure 13:
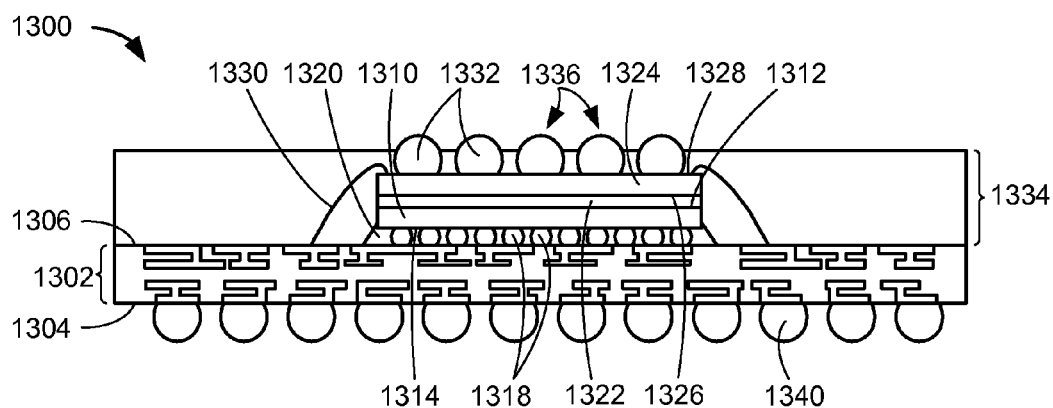
FIG. 13 is a cross-sectional view of an integrated circuit packaging system in a fourth embodiment of the present invention.

Referring now to FIG. 13, therein is shown a cross-sectional view of an integrated circuit packaging system 1300 in a fourth embodiment of the present invention. The integrated circuit packaging system 1300 can include a fan-in package-on-package (Fi-PoP).

The integrated circuit packaging system 1300 can be formed in a manner similar to the integrated circuit packaging system 100 of FIG. 1, except for the formation of the stack connectors 132 of FIG. 1 and the adhesive film layer 134 of FIG. 1. Further, the integrated circuit packaging system 1300 can be formed in a manner similar to the integrated circuit packaging system 100, except for an addition of an adhesive, an interface, and a connector.

The integrated circuit packaging system 1300 can include a package substrate 1302 having a substrate bottom side 1304 and a substrate top side 1306. The package substrate 1302 can be formed in a manner similar to the package substrate 102 of FIG. 1.

The integrated circuit packaging system 1300 can include an integrated circuit 1310 having an inactive side 1312 and an active side 1314. The integrated circuit packaging system 1300 can include device connectors 1318 and an underfill layer 1320. The integrated circuit 1310, the device connectors 1318, and the underfill layer 1320 can be formed in a manner similar to the integrated circuit 110 of FIG. 1, the device connectors 118 of FIG. 1, and the underfill layer 120 of FIG. 1, respectively.

A device-interposer attach layer 1322 attaches an interface module 1324 to the inactive side 1312. The device-interposer attach layer 1322 can include an attach material including an adhesive or an epoxy. The interface module 1324 provides an interface that electrically connects the package substrate 1302 and another package, which can be stacked over the interface module 1324. For example, the interface module 1324 can include an interface including an interposer or an internal stacking module (ISM).

The interface module 1324 can include an interface bottom side 1326 and an interface top side 1328 opposite the interface bottom side 1326. The interface bottom side 1326 can be attached to the device-interposer attach layer 1322. In an alternative embodiment, the interface module 1324 and the device-interposer attach layer 1322 can be replaced by a redistribution layer (RDL), which can be formed on the inactive side 1312 with a patterning process.

Interface connectors 1330 electrically connect the substrate top side 1306 and the interface top side 1328. The interface connectors 1330 can be adjacent a periphery of a top surface of the interface module 1324. The top surface of the interface module 1324 is at the interface top side 1328. For illustrative purposes, the interface connectors 1330 are shown as bond wires, although it is understood that the interface connectors 1330 can be any other electrical connectors.

Stack connectors 1332, which are electrically conductive connectors, can be attached to the interface top side 1328. The stack connectors 1332 provide electrical connectivity to a semiconductor component that is mounted over the interface top side 1328. The stack connectors 1332 can be electrically connected to the interface top side 1328.

The stack connectors 1332 can be electrically connected to the substrate top side 1306 with the interface module 1324 and the interface connectors 1330. In other words, the stack connectors 1332 can be electrically connected to the substrate top side 1306 with the stack connectors 1332 electrically connected to the interface top side 1328 and the interface connectors 1330 electrically connected to the interface top side 1328 and the substrate top side 1306.

The stack connectors 1332 can be formed in multiple rows or an area array inside the periphery of the top surface of the interface module 1324. The stack connectors 1332 can be formed adjacent the interface connectors 1330 with the interface connectors 1330 between the periphery of the top surface of the interface module 1324 and the stack connectors 1332.

An adhesive film layer 1334 can be formed over the substrate top side 1306. The adhesive film layer 1334 is formed with an insulating material to provide mechanical and environmental protection. The adhesive film layer 1334 can cover the integrated circuit 1310, the underfill layer 1320, the device-interposer attach layer 1322, the interface module 1324, the interface connectors 1330, and portions of the stack connectors 1332.

The stack connectors 1332 can include exposed portions 1336, which are ends of the stack connectors 1332 that face away from the interface top side 1328. The exposed portions 1336 can be exposed and protruding from the adhesive film layer 1334.

The integrated circuit packaging system 1300 can include external interconnects 1340. The external interconnects 1340 can be formed in a manner similar to the external interconnects 140 of FIG. 1.

It has been discovered that the adhesive film layer 1334 partially encapsulating the stack connectors 1332 and the exposed portions 1336 of the stack connectors 1332 protruding from the adhesive film layer 1334 significantly improve solder joint reliability for a packaging system having a structure with the interface module 1324.

Figure 14:
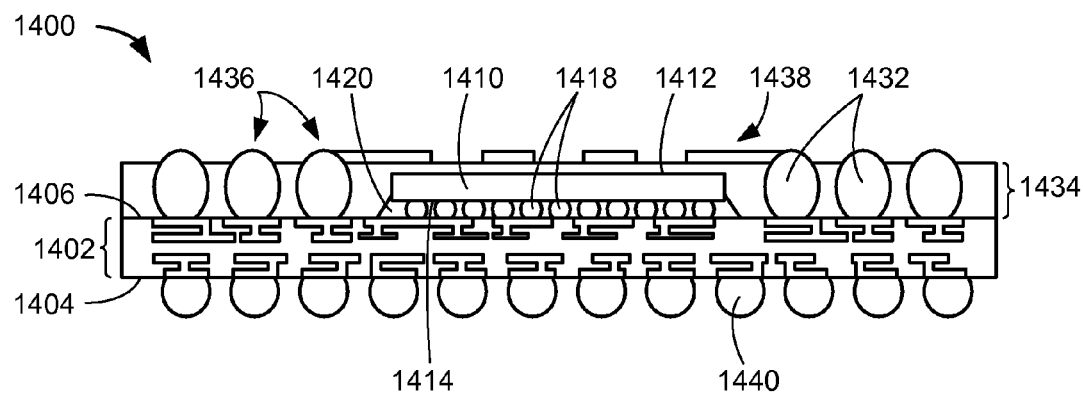
FIG. 14 is a cross-sectional view of an integrated circuit packaging system in a fifth embodiment of the present invention.

Referring now to FIG. 14, therein is shown a cross-sectional view of an integrated circuit packaging system 1400 in a fifth embodiment of the present invention. The integrated circuit packaging system 1400 can include a package with a redistribution layer (RDL) on an adhesive film. The integrated circuit packaging system 1400 can be formed in a manner similar to the integrated circuit packaging system 100 of FIG. 1, except for an addition of a conductive layer.

The integrated circuit packaging system 1400 can include a package substrate 1402 having a substrate bottom side 1404 and a substrate top side 1406. The package substrate 1402 can be formed in a manner similar to the package substrate 102 of FIG. 1.

The integrated circuit packaging system 1400 can include an integrated circuit 1410 having an inactive side 1412 and an active side 1414. The integrated circuit 1410 can be formed in a manner similar to the integrated circuit 110 of FIG. 1.

The integrated circuit packaging system 1400 can include device connectors 1418, an underfill layer 1420, and stack connectors 1432. The device connectors 1418, the underfill layer 1420, and the stack connectors 1432 can be formed in a manner similar to the device connectors 118 of FIG. 1, the underfill layer 120 of FIG. 1, and the stack connectors 132 of FIG. 1, respectively.

The integrated circuit packaging system 1400 can include an adhesive film layer 1434. The adhesive film layer 1434 can be formed in a manner similar to the adhesive film layer 134 of FIG. 1.

The stack connectors 1432 can include exposed portions 1436. The exposed portions 1436 can be formed in a manner similar to the exposed portions 136 of FIG. 1.

The integrated circuit packaging system 1400 can include external interconnects 1440. The external interconnects 1440 can be formed in a manner similar to the external interconnects 140 of FIG. 1.

A redistribution layer 1438 (RDL) can be formed directly on the adhesive film layer 1434. The redistribution layer 1438 is a conductive layer that provides electrical connectivity. The redistribution layer 1438 can electrically connect the exposed portions 1436 of the stack connectors 1432 to a semiconductor component (not shown) that is mounted over the integrated circuit packaging system 1400.

The redistribution layer 1438 can include contact pads (not shown) formed directly on the adhesive film layer 1434 to provide electrical connectivity to the semiconductor component. The contact pads can function as test points.

It has been discovered that the adhesive film layer 1434 partially encapsulating the stack connectors 1432 and the exposed portions 1436 of the stack connectors 1432 protruding from the adhesive film layer 1434 significantly improve solder joint reliability for a packaging system having a structure with the redistribution layer 1438.

Figure 15:
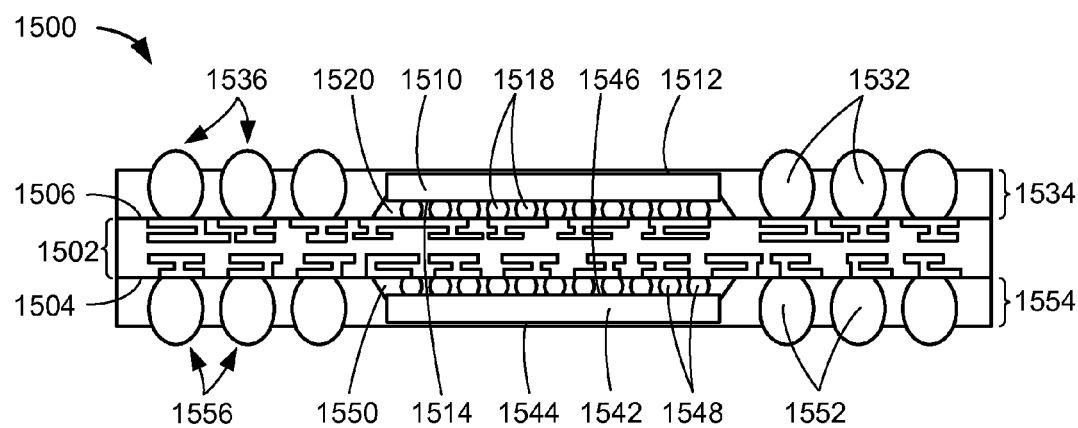
FIG. 15 is a cross-sectional view of an integrated circuit packaging system in a sixth embodiment of the present invention.

Referring now to FIG. 15, therein is shown a cross-sectional view of an integrated circuit packaging system 1500 in a sixth embodiment of the present invention. The integrated circuit packaging system 1500 can include a package with a double-sided encapsulation.

The integrated circuit packaging system 1500 can be formed in a manner similar to the integrated circuit packaging system 100 of FIG. 1, except for an addition of an electrical device, connectors, an underfill, and an adhesive. Further, the integrated circuit packaging system 1500 can be formed in a manner similar to the integrated circuit packaging system 100, except without the external interconnects 140 of FIG. 1.

The integrated circuit packaging system 1500 can include a package substrate 1502 having a substrate bottom side 1504 and a substrate top side 1506. The package substrate 1502 can be formed in a manner similar to the package substrate 102 of FIG. 1.

The integrated circuit packaging system 1500 can include a top integrated circuit 1510 having a top inactive side 1512 and a top active side 1514. The top integrated circuit 1510 can be formed in a manner similar to the integrated circuit 110 of FIG. 1.

The integrated circuit packaging system 1500 can include top device connectors 1518, a top underfill layer 1520, and top stack connectors 1532. The top device connectors 1518, the top underfill layer 1520, and the top stack connectors 1532 can be formed in a manner similar to the device connectors 118 of FIG. 1, the underfill layer 120 of FIG. 1, and the stack connectors 132 of FIG. 1, respectively.

The integrated circuit packaging system 1500 can include a top adhesive film layer 1534. The top adhesive film layer 1534 can be formed in a manner similar to the adhesive film layer 134 of FIG. 1. In an alternative embodiment, the top adhesive film layer 1534 can cover a portion of the top integrated circuit 1510, leaving the top inactive side 1512 exposed from the top adhesive film layer 1534.

The top stack connectors 1532 can include top exposed portions 1536, which are ends of the top stack connectors 1532 that face away from the substrate top side 1506. The top exposed portions 1536 can be exposed and protruding from the top adhesive film layer 1534.

A bottom integrated circuit 1542 can be mounted over a central portion of the substrate bottom side 1504. The bottom integrated circuit 1542 is a semiconductor device including a flip chip, a flip chip die, or an integrated circuit die. The bottom integrated circuit 1542 can include a bottom inactive side 1544 and a bottom active side 1546 opposite the bottom inactive side 1544.

Bottom device connectors 1548 electrically connect the substrate bottom side 1504 and the bottom integrated circuit 1542. The bottom device connectors 1548 can be attached to the substrate bottom side 1504 and the bottom active side 1546.

A bottom underfill layer 1550 can be formed between the substrate bottom side 1504 and the bottom active side 1546 to protect the bottom device connectors 1548. The bottom underfill layer 1550 can be formed surrounding the bottom device connectors 1548.

Bottom stack connectors 1552, which are electrically conductive connectors, can be attached to the substrate bottom side 1504. The bottom stack connectors 1552 provide electrical connectivity to a semiconductor component that is mounted over the substrate bottom side 1504. The bottom stack connectors 1552 can be electrically connected to the substrate bottom side 1504.

The bottom stack connectors 1552 can be adjacent non-horizontal sides of the bottom integrated circuit 1542. The bottom stack connectors 1552 can be between the bottom integrated circuit 1542 and a periphery of a bottom surface of the package substrate 1502. The bottom surface of the package substrate 1502 is at the substrate bottom side 1504.

A bottom adhesive film layer 1554 can be formed over the substrate bottom side 1504 and the bottom integrated circuit 1542. The bottom adhesive film layer 1554 is formed with an insulating material to provide mechanical and environmental protection.

The bottom adhesive film layer 1554 can cover the bottom integrated circuit 1542, the bottom underfill layer 1550, and portions of the bottom stack connectors 1552. In an alternative embodiment, the bottom adhesive film layer 1554 can cover a portion of the bottom integrated circuit 1542, leaving the bottom inactive side 1544 exposed from the bottom adhesive film layer 1554.

The bottom stack connectors 1552 can include bottom exposed portions 1556, which are ends of the bottom stack connectors 1552 that face away from the substrate bottom side 1504. The bottom exposed portions 1556 can be exposed and protruding from the bottom adhesive film layer 1554.

It has been discovered that the top adhesive film layer 1534 and the bottom adhesive film layer 1554 partially encapsulating the top stack connectors 1532 and the bottom stack connectors 1552, respectively, and the top exposed portions 1536 protruding from the top adhesive film layer 1534 and the bottom exposed portions 1556 protruding from the bottom adhesive film layer 1554 significantly improve solder joint reliability.

Figure 16:
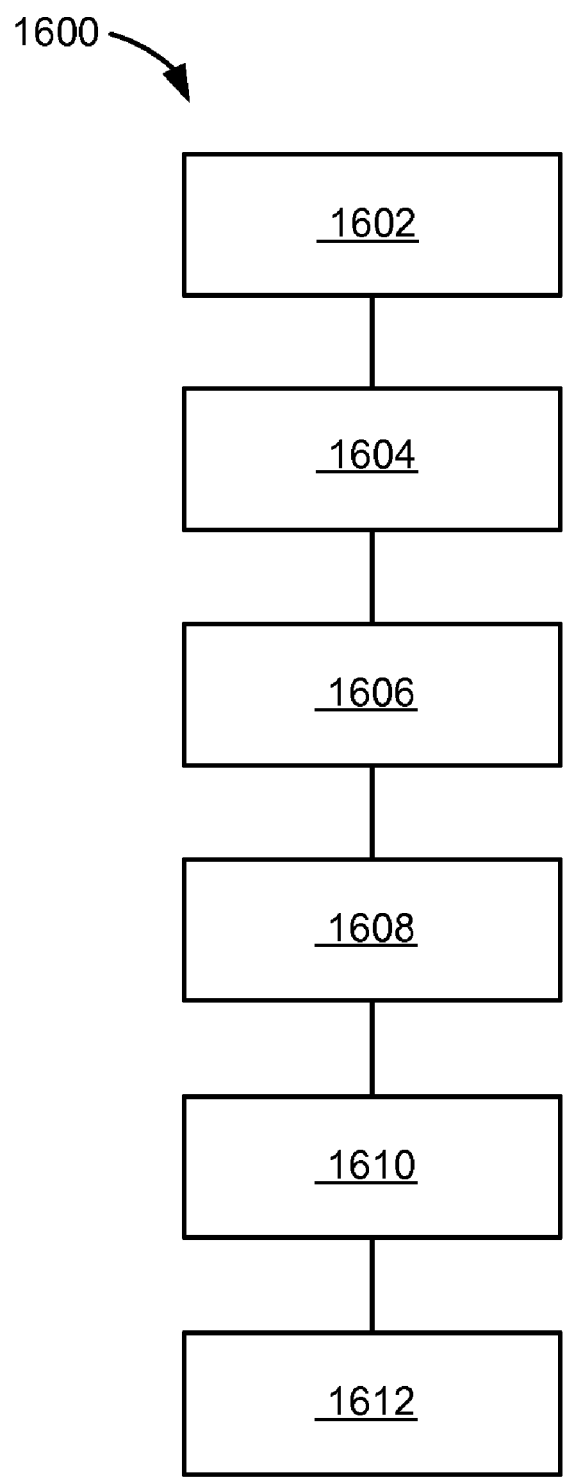
FIG. 16 is a flow chart of a method of manufacture of the integrated circuit packaging system in a further embodiment of the present invention.

Referring now to FIG. 16, therein is shown a flow chart of a method 1600 of manufacture of the integrated circuit packaging system 100 in a further embodiment of the present invention. The method 1600 includes: providing a package substrate having a substrate bottom side and a substrate top side opposite the substrate bottom side in a block 1602; mounting an integrated circuit over the package substrate, the integrated circuit having an inactive side and an active side opposite the inactive side in a block 1604; connecting stack connectors to the substrate top side in a block 1606; applying a multi-layer film over the substrate top side, the integrated circuit, and the stack connectors, the multi-layer film having a base film layer, a penetrable film layer, and a penetrable adhesive in a block 1608; removing the base film layer and the penetrable film layer to expose the penetrable adhesive and exposed portions of the stack connectors in a block 1610; and forming an adhesive film layer by hardening the penetrable adhesive in a block 1612.

The present invention can include an integrated circuit packaging system having a structure with an encapsulation including an adhesive film layer. The encapsulation can be formed on a substrate including a leadframe, a cavity substrate, a substrate with a recess, a silicon substrate, or a temporary carrier to form a fan-out wafer level chip scale package (Fo-WLCSP).

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package substrate having a substrate bottom side and a substrate top side opposite the substrate bottom side;
   mounting an integrated circuit over the package substrate;
   connecting stack connectors to the substrate top side;
   applying a multi-layer film over the substrate top side, the integrated circuit, and the stack connectors, the multi-layer film having a base film layer, a penetrable film layer, and a penetrable adhesive;
   removing the base film layer and the penetrable film layer to expose the penetrable adhesive and exposed portions of the stack connectors; and
   forming an adhesive film layer from the penetrable adhesive, with the adhesive film layer having a rough top surface characteristic of being formed from the penetrable film layer being removed.

2. The method as claimed in claim 1 wherein connecting the stack connectors includes connecting the stack connectors to the substrate top side surrounding the integrated circuit.

3. The method as claimed in claim 1 wherein connecting the stack connectors includes connecting the stack connectors to the substrate top side between the integrated circuit and a periphery of the package substrate.

4. The method as claimed in claim 1 wherein removing the base film layer and the penetrable film layer includes removing the base film layer and the penetrable film layer to expose the exposed portions protruding from the adhesive film layer.

5. The method as claimed in claim 1 wherein mounting the integrated circuit includes mounting a wirebond die over the package substrate.

6. A method of manufacture of an integrated circuit packaging system comprising:
   providing a package substrate having a substrate bottom side and a substrate top side opposite the substrate bottom side;
   mounting an integrated circuit over the package substrate;
   connecting device connectors to the substrate top side and the integrated circuit;
   connecting stack connectors to the substrate top side;
   applying a multi-layer film over the substrate top side, the integrated circuit, and the stack connectors, the multi-layer film having a base film layer, a penetrable film layer, and a penetrable adhesive;
   removing the base film layer and the penetrable film layer to expose the penetrable adhesive and exposed portions of the stack connectors; and
   forming an adhesive film layer from the penetrable adhesive, with the adhesive film layer having a rough top surface characteristic of being formed from the penetrable film layer being removed.

7. The method as claimed in claim 6 wherein mounting the integrated circuit includes mounting the integrated circuit over the package substrate, the integrated circuit having vertical insertion areas electrically connected to the device connectors.

8. The method as claimed in claim 6 wherein connecting the stack connectors includes:
   connecting an interface module to the substrate top side; and
   connecting the stack connectors to the interface module.

9. The method as claimed in claim 6 further comprising forming a redistribution layer on the adhesive film layer.

10. The method as claimed in claim 6 further comprising:
    connecting bottom stack connectors to the substrate bottom side; and
    forming a bottom adhesive film layer covering portions of the bottom stack connectors.

11. An integrated circuit packaging system comprising:
    a package substrate having a substrate bottom side and a substrate top side opposite the substrate bottom side;
    an integrated circuit over the package substrate;
    stack connectors connected to the substrate top side; and
    an adhesive film layer over the substrate top side covering the integrated circuit and exposing exposed portions of the stack connectors, the adhesive film layer having a rough top surface characteristic of a penetrable film layer being removed from a penetrable adhesive.

12. The system as claimed in claim 11 wherein the stack connectors are connected to the substrate top side surrounding the integrated circuit.

13. The system as claimed in claim 11 wherein the stack connectors are connected to the substrate top side between the integrated circuit and a periphery of the package substrate.

14. The system as claimed in claim 11 wherein the integrated circuit is a flip chip over the package substrate.

15. The system as claimed in claim 11 wherein the integrated circuit is a wirebond die over the package substrate.

16. The system as claimed in claim 11 further comprising device connectors connected to the substrate top side and the integrated circuit.

17. The system as claimed in claim 16 wherein the integrated circuit is over the package substrate, the integrated circuit having vertical insertion areas electrically connected to the device connectors.

18. The system as claimed in claim 16 further comprising:
    an interface module connected to the substrate top side; and
    wherein:
    the stack connectors are connected to the interface module.

19. The system as claimed in claim 16 further comprising a redistribution layer on the adhesive film layer.

20. The system as claimed in claim 16 further comprising:
    bottom stack connectors connected to the substrate bottom side; and
    a bottom adhesive film layer covering portions of the bottom stack connectors.

* * * * *